United States Patent
Fujiwara et al.

(10) Patent No.: US 9,116,063 B2
(45) Date of Patent: Aug. 25, 2015

(54) SENSOR UNIT

(75) Inventors: Hideki Fujiwara, Musashino (JP);
Akihiro Ooshima, Musashino (JP);
Tomotaka Morikawa, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 538 days.

(21) Appl. No.: 13/532,331

(22) Filed: Jun. 25, 2012

(65) Prior Publication Data

US 2012/0324998 A1 Dec. 27, 2012

(30) Foreign Application Priority Data

Jun. 23, 2011 (JP) .................................. 2011-139384

(51) Int. Cl.

| | |
|---|---|
| G01L 9/12 | (2006.01) |
| G01L 13/02 | (2006.01) |
| G01L 9/00 | (2006.01) |
| G01L 19/14 | (2006.01) |
| G01L 13/00 | (2006.01) |
| G01L 19/06 | (2006.01) |

(52) U.S. Cl.
CPC .............. G01L 13/025 (2013.01); G01L 9/0008 (2013.01); G01L 9/0016 (2013.01); G01L 9/0048 (2013.01); G01L 19/0645 (2013.01); G01L 19/142 (2013.01); G01L 19/147 (2013.01); *G01L 13/00* (2013.01); *G01L 19/0627* (2013.01)

(58) Field of Classification Search
USPC .................................................. 73/700–756
See application file for complete search history.

(56) References Cited

U.S. PATENT DOCUMENTS

| | | | | |
|---|---|---|---|---|
| 5,201,228 A | * | 4/1993 | Kojima et al. ................... | 73/724 |
| 5,962,791 A | * | 10/1999 | Walchli et al. .................. | 73/755 |
| 6,568,274 B1 | * | 5/2003 | Lucas et al. ..................... | 73/718 |
| 7,677,109 B2 | * | 3/2010 | Bentley et al. .................. | 73/756 |
| 2002/0078756 A1 | * | 6/2002 | Akiyama et al. ................ | 73/718 |
| 2004/0187588 A1 | * | 9/2004 | Miyazawa ....................... | 73/716 |
| 2009/0108382 A1 | | 4/2009 | Eriksen et al. | |
| 2009/0266173 A1 | * | 10/2009 | Kobayashi et al. ............. | 73/724 |
| 2009/0314096 A1 | * | 12/2009 | Colombo ......................... | 73/754 |

FOREIGN PATENT DOCUMENTS

| | | |
|---|---|---|
| JP | 5223669 A | 8/1993 |
| JP | 8-10169 B2 | 1/1996 |

(Continued)

OTHER PUBLICATIONS

"Oscillating Si pressure sensor in which an oscillator with a Q factor of 50,000 is inserted into a vacuum chamber in a diaphragm", Nikkei Electronics, Jun. 27, 1988, pp. 96-97, No. 450.

(Continued)

*Primary Examiner* — Andre Allen
(74) *Attorney, Agent, or Firm* — Sughrue Mion, PLLC

(57) ABSTRACT

A sensor unit may include a ceramic member including a first face and a second face opposite to each other with a predetermined interval, a sensor part mounted on the first face, a plurality of metal pins fixed to the second face, a plurality of internal wirings passing through the ceramic member, each of the plurality of internal wirings connecting the sensor part with one of the plurality of metal pins, and a metal member formed on a circumferential end of the second face and joined with a housing by welding.

19 Claims, 15 Drawing Sheets

(56) References Cited

FOREIGN PATENT DOCUMENTS

| JP | 200174582 A | 3/2001 |
| JP | 200445216 A | 2/2004 |
| JP | 2008203117 A | 9/2008 |
| JP | 2009265041 A | 11/2009 |
| JP | 2010197057 A | 9/2010 |
| WO | 2010089261 A2 | 8/2010 |

OTHER PUBLICATIONS

European Search Report corresponding to European Patent Application No. 12171609.6, dated Oct. 16, 2012.

* cited by examiner

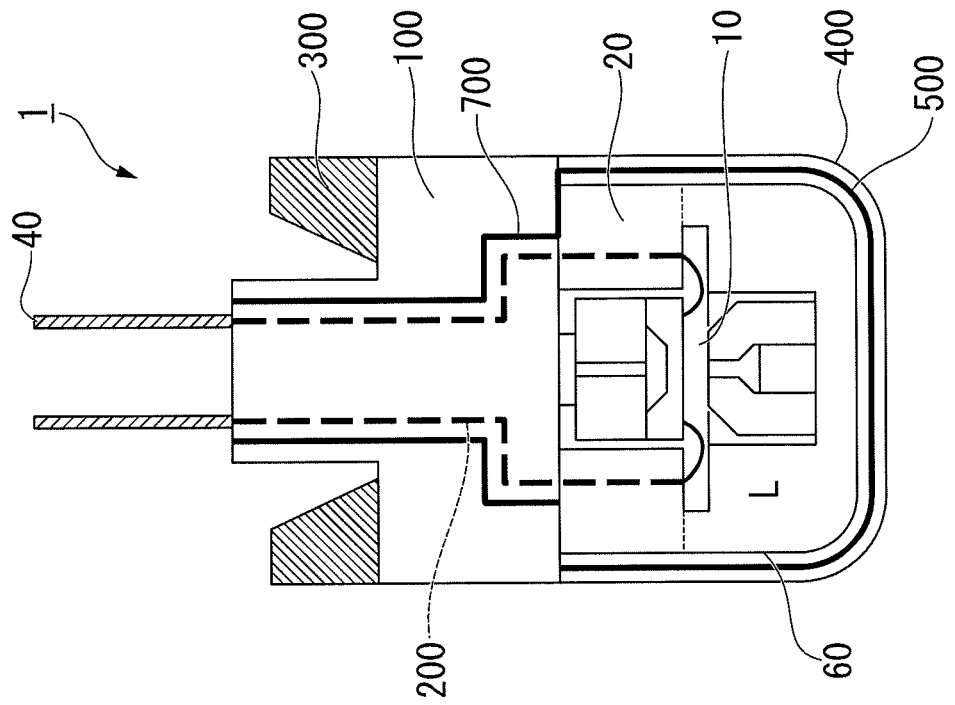
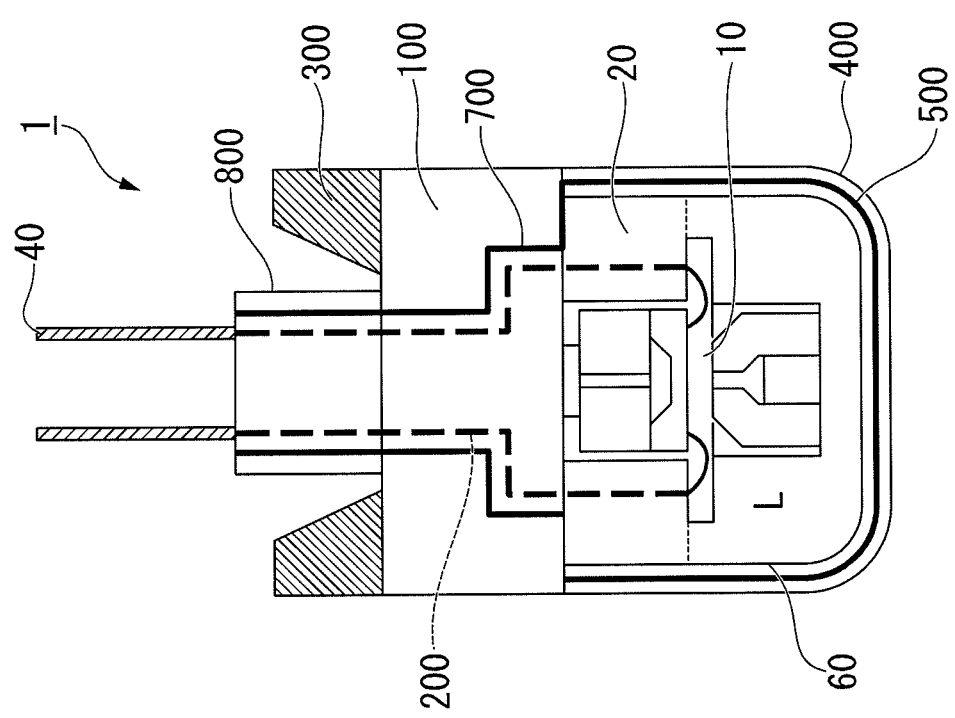

FIG. 13

|  |  | CALCULATED VALUE | MEASURED VALUE |
|---|---|---|---|
| AVG | | 2.48pF | 2.60pF |
| 3σ | SEALING RADIUS RATIO b/a | 0.038pF | 0.146pF | 0.146pF |
| | SEALING LENGTH L | 0.089pF | | |
| | SEALING CENTER GAP | 0.019pF | | |

SENSOR UNIT

BACKGROUND OF THE INVENTION

1. Field of the Invention

The present invention relates to an improved sensor unit that measures a physical amount in a process control. The present invention is efficiently applied to a sensor unit for a differential pressure/pressure transmitter, and more particularly to a pressure container, and a vacuum sealed device, a vacuum sealed element or an assembly thereof.

Priority is claimed on Japanese Patent Application No. 2011-139384, filed Jun. 23, 2011, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

FIG. 9 is a cross-sectional view illustrating a configuration example of a sensor unit 1 applied to a differential pressure/pressure transmitter in accordance with the related art. A vibratory sensor part 10 is fixed on a support 20 formed of an insulator having a hollow part. A metal body 30 includes a first face 30a and a second face 30b opposite to each other with a predetermined interval. The support 20 is mounted on the first face 30a of the metal body 30. A structure and operation principle of a vibratory differential-pressure sensor are disclosed in detail in Japanese Examined Patent Application, Second Publication No. H8-10169 and NIKKEI ELECTRONICS 1988 Jun. 27 (No. 450) pp 96-97.

The metal body 30 includes a plurality of through-holes 30c formed in a thickness direction thereof. A plurality of metal pins 40, which are inserted from the second face 30b into the through-holes 30c of the metal body 30, pass through the support 20, and are electrically connected to a predetermined terminal of the sensor part 10. The metal pins 40 serve as input and output terminals of the sensor part 10.

Each through-hole 30c of the metal body 30 has an internal hermetic structure in which the corresponding metal pin 40 and the metal body 30 are sealed by a glass material 50. The glass material 50 includes concave menisci 50a on upper and lower surfaces thereof.

An upper portion of the sensor part 10 is covered with a sealing liquid capsule 60, and includes a sealing liquid chamber L. The sealing liquid capsule 60 is covered with a cup-shaped metal cap 70, and an open end thereof is welded to a circumferential end of the first face 30a of the metal body 30.

FIG. 10 is a cross-sectional view illustrating a junction relation of the sensor unit to a housing in accordance with the related art. The sensor unit 1 shown in FIG. 10 is inserted into a hole 80a of the housing 80 in a direction P, and a circumferential end of the second face 30b of the metal body 30 is fixedly joined with a circumferential end of the hole 80a of the housing 80 by welding 90. The housing 80 is connected to a frame ground FG.

The case in which noise is applied to the frame ground FG will be described using the configuration shown in FIGS. 9 and 10. The noise applied to the frame ground is input to the metal pins 40 via parasitic capacitance of the portion sealed by the glass material 50, and is transferred to a signal line.

FIGS. 11A and 11B are diagrams illustrating an equivalent circuit formed of noise, parasitic capacitance, and a sensor part in accordance with the related art. FIG. 11A shows an equivalent circuit when noise Vni is applied to the sensor part 10 made up of an H-type oscillator driven electromagnetically. Among the symbols, Ch1 and Ch2 indicate capacitances between the metal pins 40 and the frame ground FG, R1 to R3 indicate resistances of the oscillator, and Vno indicates an output noise voltage. The output noise voltage Vno is input into a differential amplifier Q.

FIG. 11B is an equivalent circuit into which that of FIG. 11A is simplified. In this equivalent circuit, a transfer characteristic of noise G(s) is expressed as Equation 1.

$$G(s) = \frac{V_{no}}{V_{n1}} = \frac{\left(\frac{1}{sC_{h2}}R_1 - \frac{1}{sC_{h1}}R_2\right)R_3}{\frac{1}{sC_{h2}}R_2\left(\frac{1}{sC_{h1}} + R_1\right) + \frac{1}{sC_{h1}}R_1\left(\frac{1}{sC_{h2}} + R_2\right) + \left(\frac{1}{sC_{h2}} + R_2\right)\left(R_1 + \frac{1}{sC_{h1}}\right)R_3} \quad \text{Equation 1}$$

It can be seen from FIG. 11B that, since the equivalent circuit is a bridge circuit, noise is easily transferred when variability between R1 and R2 and variability between Ch1 and Ch2 increase. Since R1 and R2 are formed by a semiconductor process, the variability can be reduced.

On the other hand, the variability between Ch1 and Ch2 is dependent on mechanical precision, and thus tends to increase, compared to the variability between R1 and R2. The parasitic capacitance Ch between the frame ground FR and the metal pin 40 is expressed as Equation 2.

$$C_h = \frac{2\pi\varepsilon}{\ln\left(\frac{b}{a}\right)} L \quad \text{Equation 2}$$

To secure a breakdown voltage structure, a ratio b/a of a radius b of the through-hole 30c to a radius a of the metal pin 40 in the portion sealed by the glass material 50 is set to a range between 2 and 3.

The parasitic capacitance between the metal pin 40 (i.e., signal line) and the frame ground FG has three variabilities: a sealing radius ratio b/a, a sealing length L, and sealing eccentricity.

FIGS. 12A to 12F are characteristic diagrams that explain a relation between the sealed portion and the parasitic capacitance in accordance with the related art. FIG. 12A shows a parasitic capacitance variability according to the sealing radius ratio b/a, and FIG. 12D shows a sensitivity variability according to the sealing radius ratio b/a. FIG. 12B shows a parasitic capacitance variability according to the sealing length L, and FIG. 12E shows a sensitivity variability according to the sealing length L. FIG. 12C shows a parasitic capacitance variability according to the sealing eccentricity, and FIG. 12F shows a sensitivity variability according to the sealing eccentricity.

FIG. 13 is a table illustrating measured values of parasitic capacitance, in which the values of FIGS. 12A to 12F are arranged in accordance with the related art. When a relative permittivity c of the glass material is set to $\epsilon=7$, a hole radius b of the glass insertion part of the metal body is set to b=3 mm, a radius a of the metal pin is set to a=1 mm, and a sealing length L is set to L=7 mm as the parameters, the parasitic capacitance Ch calculated according to Equation 2 is Ch=2.5 pF.

In the variability, a measured value is equal to a calculated value. In the difference in average value, the sealing radius ratio falls within a range of the variability, because the dimensions can be controlled. The sealing eccentricity is negligible, because the sensitivity is low. In the sealing length L, since the menisci 50a are formed at the sealed portion, the dimensions cannot be controlled with high precision. This is a major factor of the variability.

FIG. 14 is a characteristic diagram illustrating results of calculating a frequency characteristic of the transfer characteristic G(s) of noise obtained by substituting variability ΔC of the parasitic capacitance into Equation 1 in a configuration example in accordance with the related art. As shown in FIG. 14, it can be found that, as ΔC increases, the transfer characteristic G(s) is easily influenced by the noise.

SUMMARY

The present invention realizes a sensor unit that inhibits the amount and variability of a parasitic capacitance between a signal line and a frame ground so as to attenuate noise, and has a high voltage/high breakdown voltage characteristic.

Further, the present invention realizes strengthening of a shield configuration, thereby strengthening electrical floating of a sensor part, and furthermore providing the attenuation of noise.

A sensor unit may include: a ceramic member including a first face and a second face opposite to each other with a predetermined interval; a sensor part mounted on the first face; a plurality of metal pins fixed to the second face; a plurality of internal wirings passing through the ceramic member, each of the plurality of internal wirings connecting the sensor part with one of the plurality of metal pins; and a metal member formed on a circumferential end of the second face and joined with a housing by welding.

The sensor unit may further include: an insulator cap covering the sensor part at the first face and fixed to a circumferential edge of the ceramic member; and a metal film shield member formed on an inner wall of the insulator cap.

The metal member may include a tapered cutout part formed on an inner circumferential wall facing the metal pins.

The sensor unit may further include: a first shield member that is formed so as to surround each of the internal wirings passing through the ceramic member.

The sensor unit may further include: a second shield member that is formed so as to surround each of the metal pins.

The sensor unit may further include: a third shield member that is formed so as to surround all the internal wirings passing through the ceramic member.

The ceramic member may be formed as multilayered ceramic members, the internal wirings may be connected together by first through-wirings between the multilayered ceramic members, and the first shield member may be formed by connecting ring-shaped metal prints formed on the multilayered ceramic members using second through-wirings.

The metal film shield member formed on the inner wall of the insulator cap may extend up to the second face of a sidewall of the ceramic member.

The sensor part may be mounted on the first face via a support.

The metal member may be ring-shaped.

The metal member may be made of Kovar (an iron-nickel-cobalt alloy).

The metal film shield member may be formed on the inner wall of the insulator cap by one of deposition based on electroless deposition and painting.

The ceramic member may have an electrode extraction part, a hole radius of the electrode extraction part may be 9 mm, a pin interval between the plurality of metal pins may be 3 mm, and a relative permittivity of the ceramic member may be 9.

The ceramic member may be formed as multilayered ceramic members, the internal wirings may be connected together by first through-wirings between the multilayered ceramic members, and the third shield member may be formed by connecting ring-shaped metal prints formed on the multilayered ceramic members using second through-wirings.

According to the present invention, due to the configuration of the ceramic member 100 including the internal wirings, it is possible to avoid generating a great parasitic capacitance from a glass sealing part in which the metal pin 40 is disposed in the through-hole 30c so as to be adjacent to the metal body 30 having a conventional structure, and to remarkably reduce the parasitic capacitance so as to lessen a noise gain.

Further, according to the present invention, the metal film shield member formed on the inner wall of the insulator cap that covers the sensor part and is fixed to the circumferential edge of the ceramic member, and shield structures of the internal wirings or the metal pins are employed to provide floating. Thereby, it is possible to reduce the parasitic capacitance of the signal line, inhibit the variability of the parasitic capacitance, and contribute to a reduction of the noise gain.

In addition, according to the present invention, the ceramic member having the internal wirings is employed. Thereby, the high-voltage/high-breakdown-voltage sensor unit can be realized, compared to a conventional structure having a glass sealing part.

BRIEF DESCRIPTION OF THE DRAWINGS

The above features and advantages of the present invention will be more apparent from the following description of certain preferred embodiments taken in conjunction with the accompanying drawings, in which:

FIG. 7A is a cross-sectional view illustrating a sensor unit in accordance with a fifth preferred embodiment of the present invention;

FIG. 7B is a cross-sectional view illustrating a sensor unit in accordance with a sixth preferred embodiment of the present invention;

FIG. 13 is a table illustrating measured values of parasitic capacitance, in which the values of FIGS. 12A to 12F are arranged in accordance with the related art.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

Figure 1:
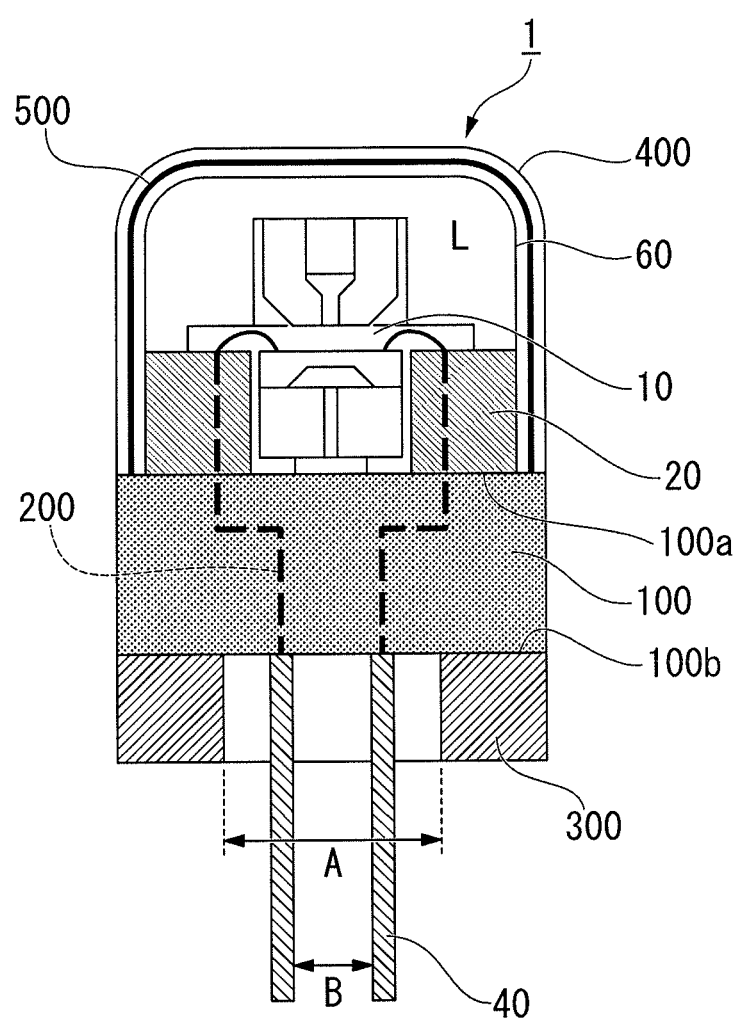
FIG. 1 is a cross-sectional view illustrating a sensor unit in accordance with a first preferred embodiment of the present invention.

FIG. 1 is a cross-sectional view illustrating a sensor unit in accordance with a first preferred embodiment of the present invention. The same or similar numerals are used to indicate the same or similar elements to the conventional configuration described in FIG. 9, and so a description thereof will be omitted here.

Figure 9:
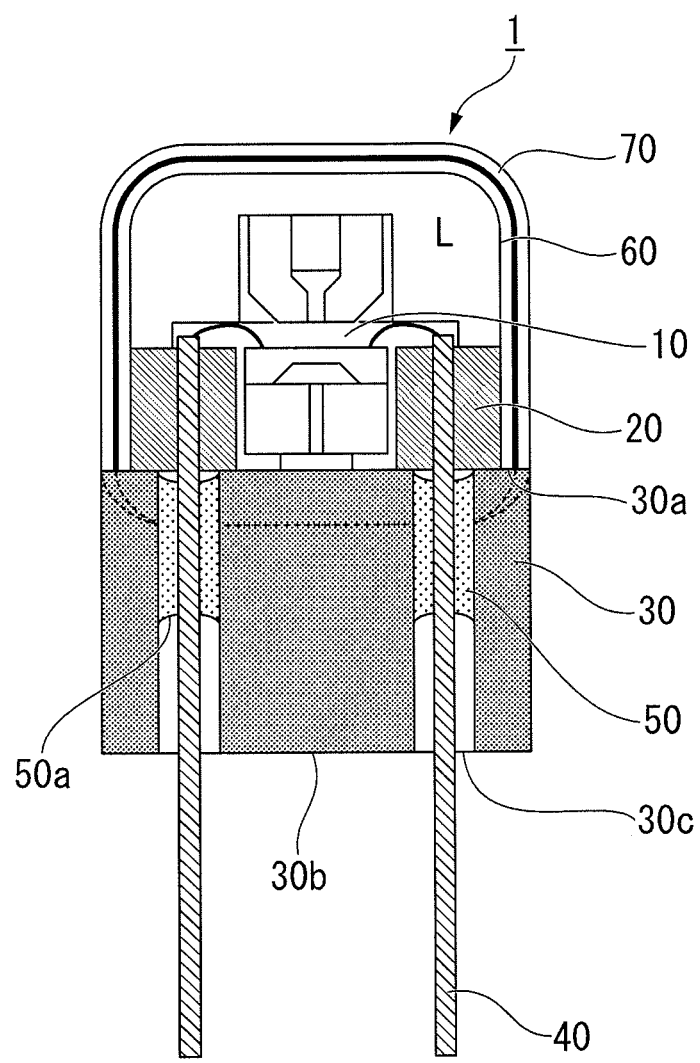
FIG. 9 is a cross-sectional view illustrating a configuration example of a sensor unit applied to a differential pressure/pressure transmitter in accordance with the related art.

A configuration of a sensor part 10, a support 20, and a sealing liquid capsule 60 is the same as that shown in FIG. 9. A ceramic member 100 includes a first face 100a and a second face 100b opposite to each other with a predetermined interval. The sensor part 10 is mounted on the first face 100a of the ceramic member 100 via the support 20.

A plurality of metal pins 40 are fixed to the second face 100b of the ceramic member 100. A plurality of internal wirings 200 pass through the ceramic member 100 and the support 20, and provide electrical connection between the sensor part 10 and the metal pins 40. Furthermore, a ring-shaped metal member 300 is fixedly joined to a circumferential edge of the second face 100b.

As a material for the metal member 300, use of Kovar (an iron-nickel-cobalt alloy), which is a low expansion material having an expansion coefficient similar to that of the ceramic member 100, is efficient. The expansion coefficient of Kovar is 6E-6 (at 20° C. to 100° C.), and the expansion coefficient of ceramic is 6E-6 (at 20° C. to 100° C.). The ceramic and the Kovar are generally joined together.

At the side of the first face 100a, an insulator cap 400 covers the sensor part 10 and is fixed to a circumferential edge of the ceramic member 100. A metal film shield member 500 is formed on an inner wall of the insulator cap by deposition based on electroless deposition or by painting. Although not shown, the metal film shield member 500 is connected to a circuit common by wiring.

In the conventional configuration shown in FIG. 9, when the relative permittivity $\epsilon$ of the glass material is set to $\epsilon$=7, the hole radius b of the glass insertion part of the metal body is set to b=3 mm, the radius a of the metal pin is set to a=1 mm, and the sealing length L is set to L=7 mm as the parameters, the parasitic capacitance Ch is calculated as Ch=2.5 pF.

On the other hand, when the ceramic member 100 having the through-wirings in accordance with the first preferred embodiment of the present invention shown in FIG. 1 has a breakdown voltage structure of the same level as a glass sealing structure, its parameters are as follows: a hole radius A of an electrode extraction part is set to A=9 mm, a pin interval B is set to B=3 mm, and a relative permittivity $\epsilon$ of the ceramic member 100 is set to $\epsilon$=9. Due to these parameters, a parasitic capacitance Ch' between the ceramic member 100 and a metal member 300 serving as a frame ground becomes Ch'=0.19 pF through the calculation of Equation 2.

In the case of this order of parasitic capacitance, the parasitic capacitance between the metal pin 40 and the metal member 300 serving as the frame ground is influenced more by the air than that between the metal member 300 serving as the frame ground and the ceramic member 100, and thus the parasitic capacitance becomes about 1/10 of the conventional glass sealing structure.

Figure 2:
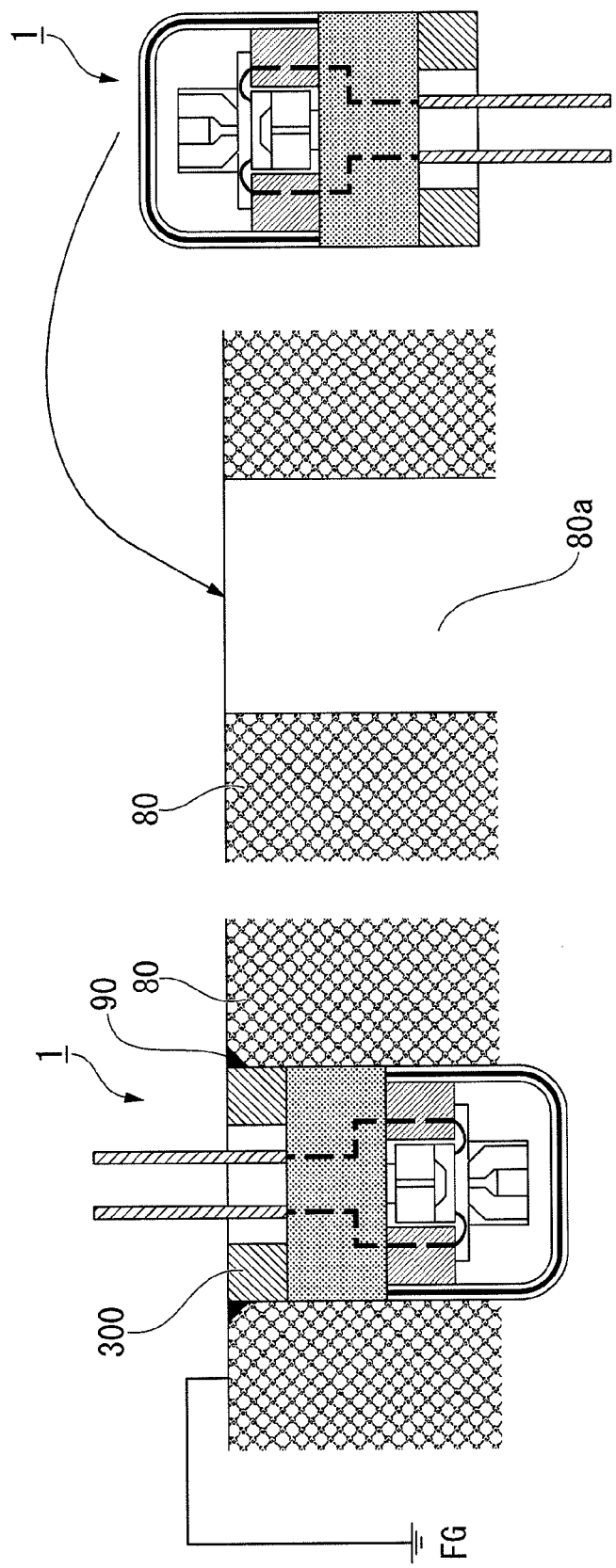
FIG. 2 is a cross-sectional view illustrating a joined relation of the sensor unit to a housing in accordance with the first preferred embodiment of the present invention.
Figure 10:
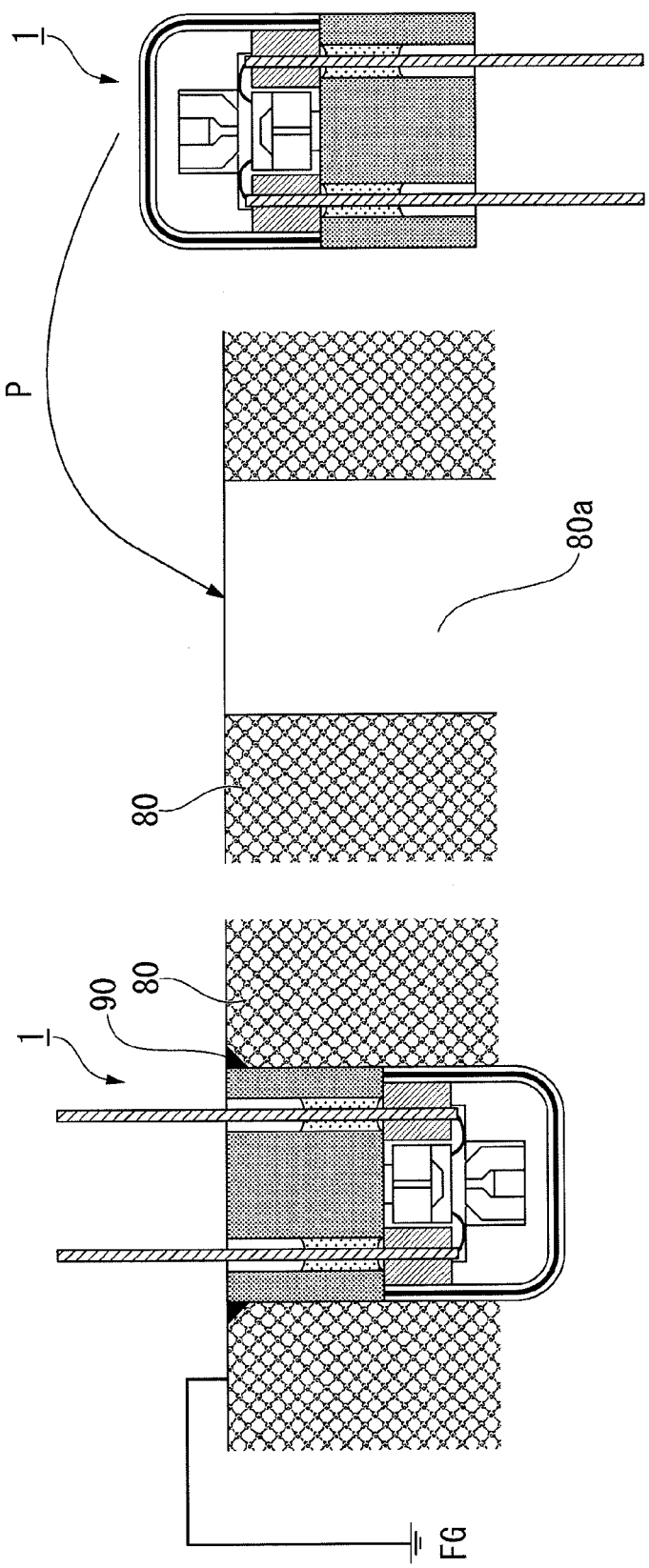
FIG. 10 is a cross-sectional view illustrating a junction relation of the sensor unit to a housing in accordance with the related art.
Figure 11A:
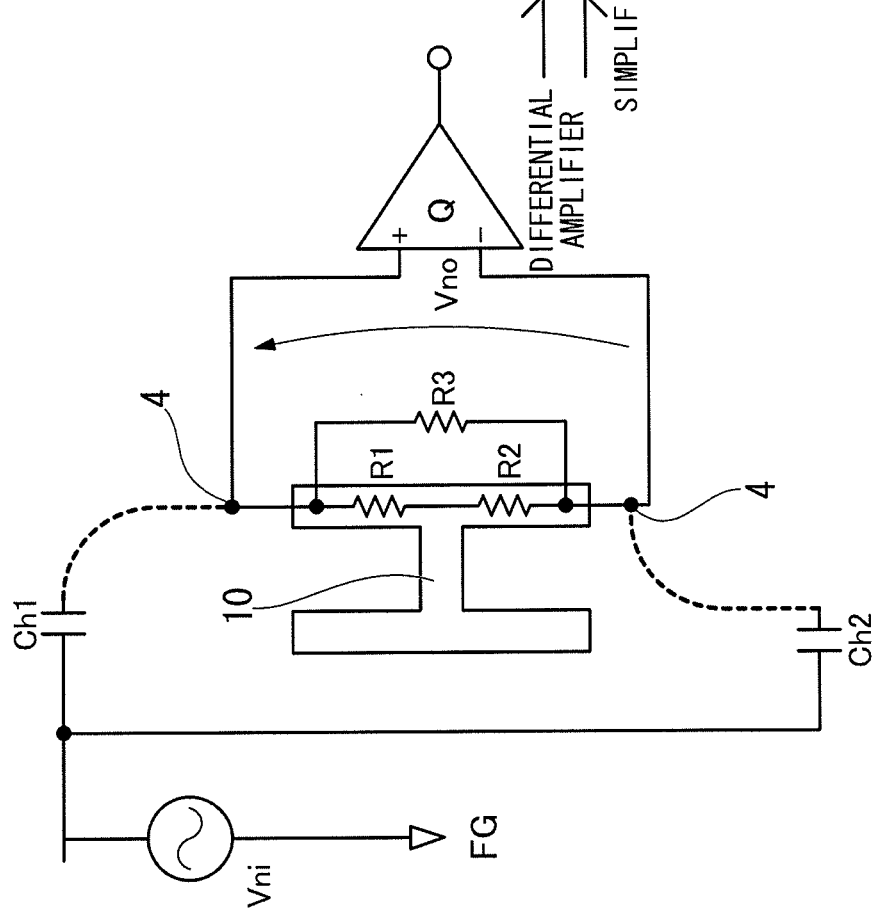
FIGS. 11A and 11B are diagrams illustrating an equivalent circuit formed of noise, parasitic capacitance, and a sensor unit in accordance with the related art.
Figure 11B:
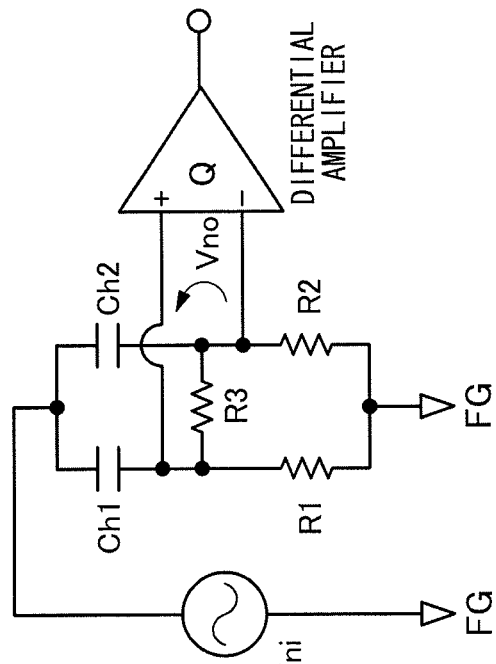
Figure 12A:
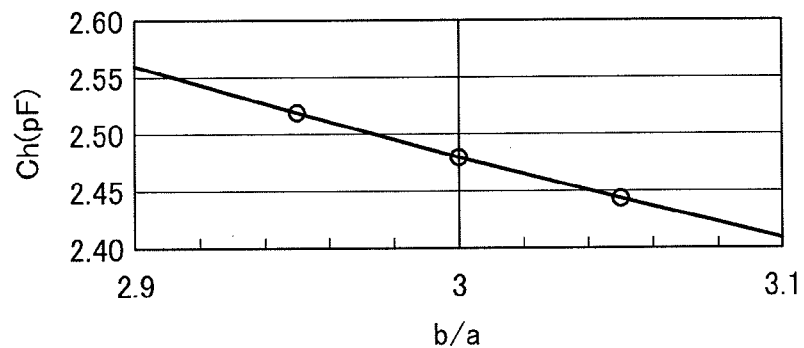
FIGS. 12A to 12F are characteristic diagrams that explain a relation between the sealed portion and the parasitic capacitance in accordance with the related art.
Figure 12B:
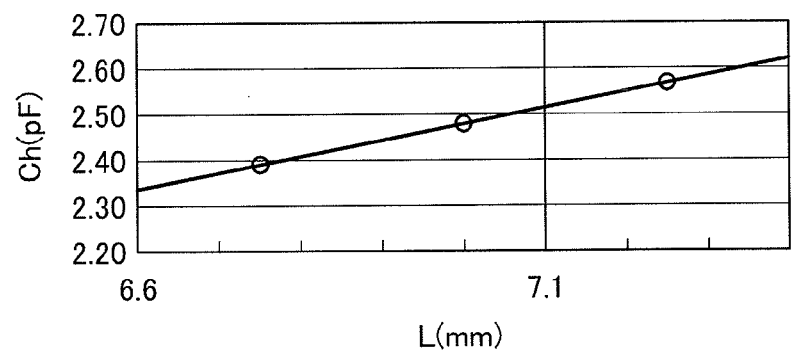
Figure 12C:
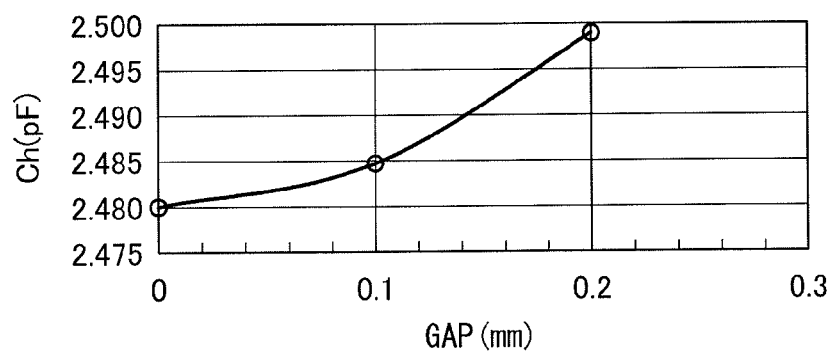
Figure 12D:
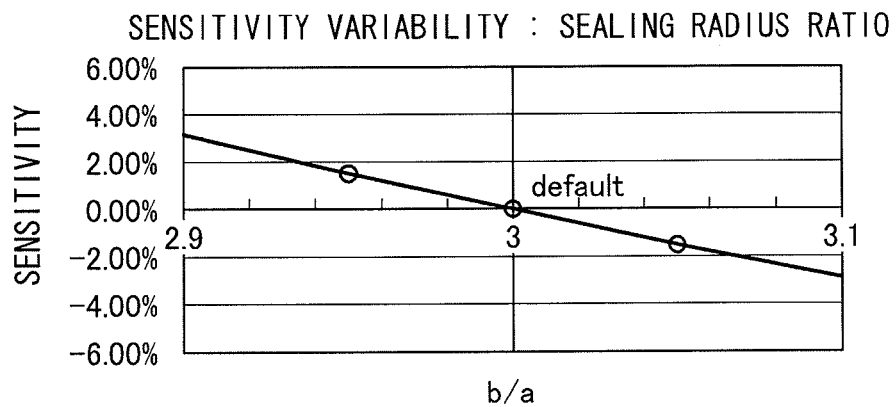
Figure 12E:
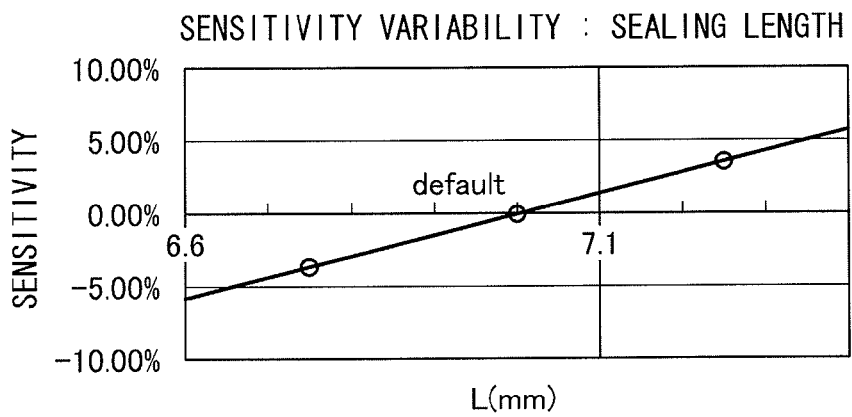
Figure 12F:
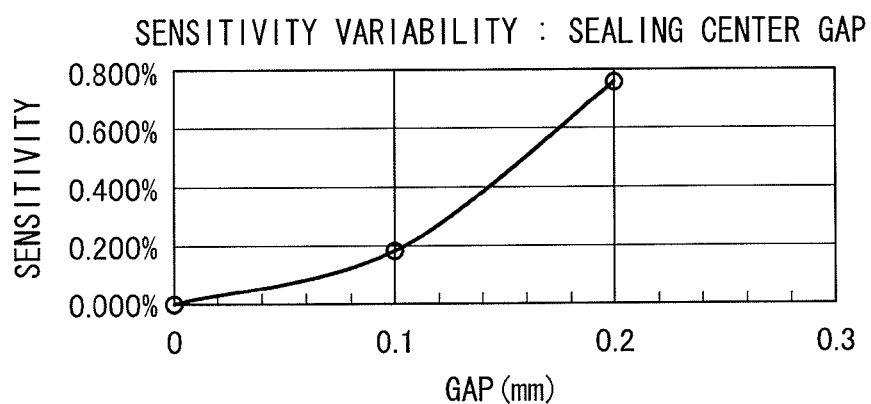

FIG. 2 is a cross-sectional view illustrating a joined relation of the sensor unit to a housing in accordance with a first preferred embodiment of the present invention. A welding structure in which the sensor unit is welded to the housing 80 is different from the conventional configuration shown in FIG. 10. In the present invention, an outer circumferential end of the metal member 300 is fixed to the housing 80 by welding 90, and the metal member 300 is set to have a potential of the frame ground FG.

In this way, the ceramic member 100 having the penetrating internal wirings 200 has a hermetic structure, and is insulated from the potential of the frame ground FG. Accordingly, the sensor unit 1 itself in which the sensor part 10 is mounted on the ceramic member 100 becomes a floating structure.

As the ceramic member 100 having the penetrating internal wirings 200 used in the present invention, use of multilayered ceramic members is efficient. The internal wirings 200 penetrating the ceramic member are connected by through-wirings between the respective multilayered ceramic members. Furthermore, the shield member formed inside the ceramic member 100 is formed by connecting ring-shaped metal prints formed on the respective multilayered ceramic members using through-wirings.

Figure 3:
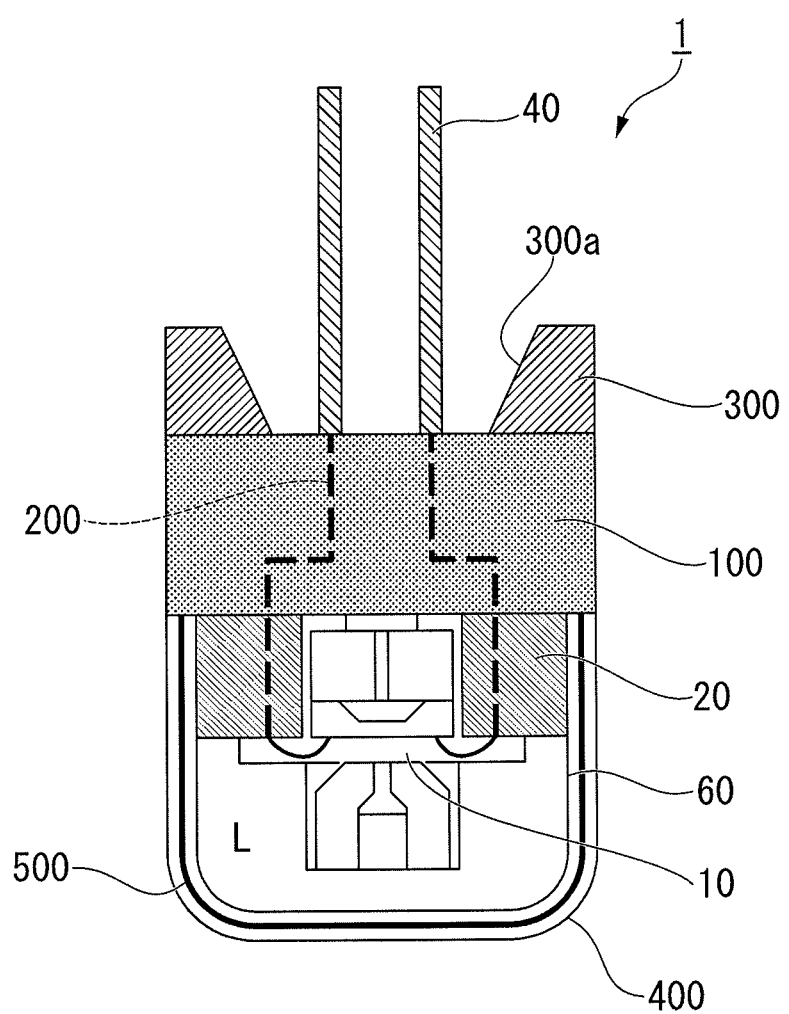
FIG. 3 is a cross-sectional view illustrating a sensor unit in accordance with a second preferred embodiment of the present invention.

FIG. 3 is a cross-sectional view illustrating a sensor unit in accordance with a second preferred embodiment of the present invention. A tapered cutout part 300a is formed on an inner circumference of the metal member 300 in consideration of the breakdown voltage structure. Thereby, the parasitic capacitance can be about 1/20 of the glass sealing structure.

Figure 4:
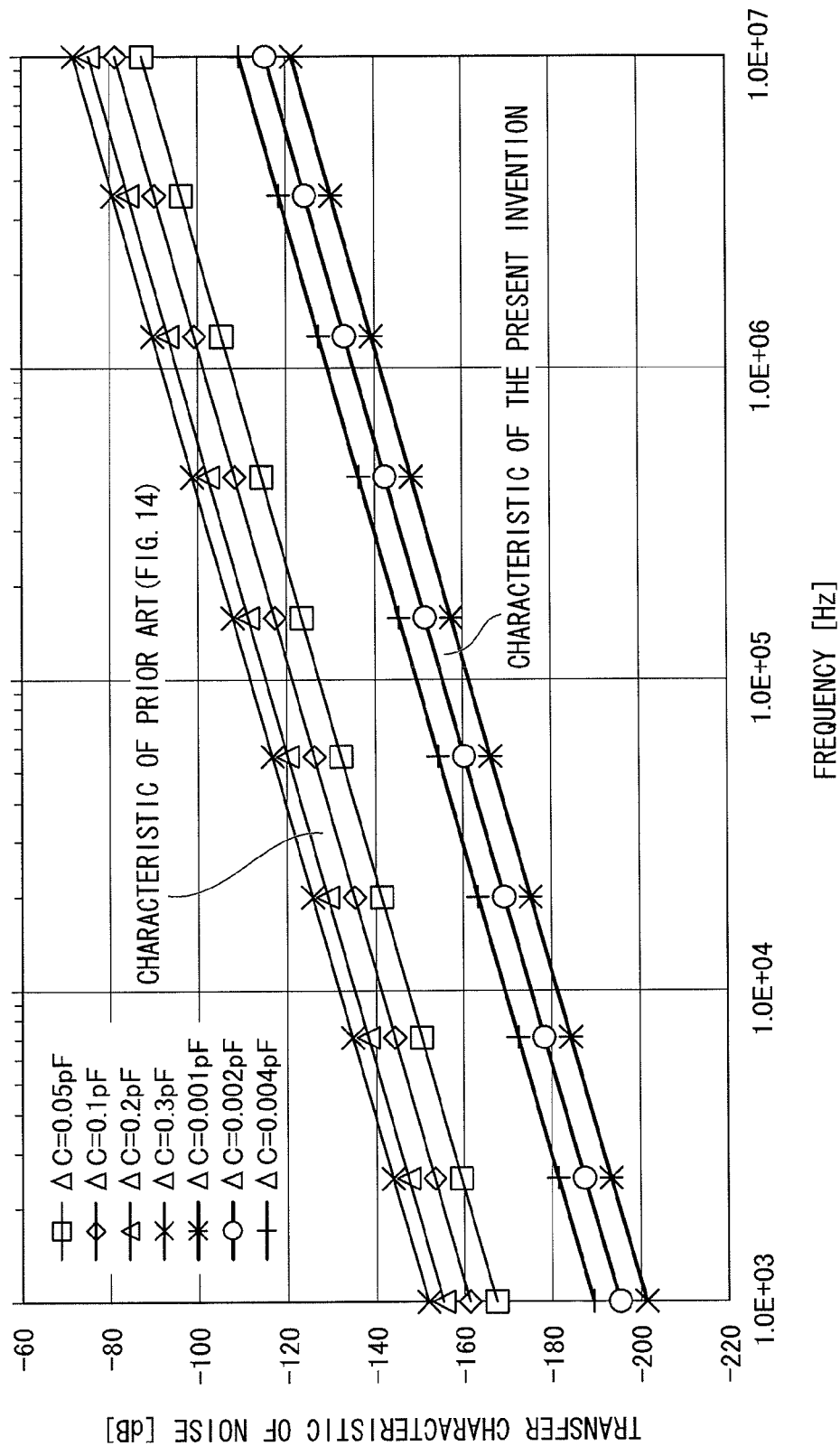
FIG. 4 is a transfer characteristic diagram of noise that explains the effects of the present invention.
Figure 14:
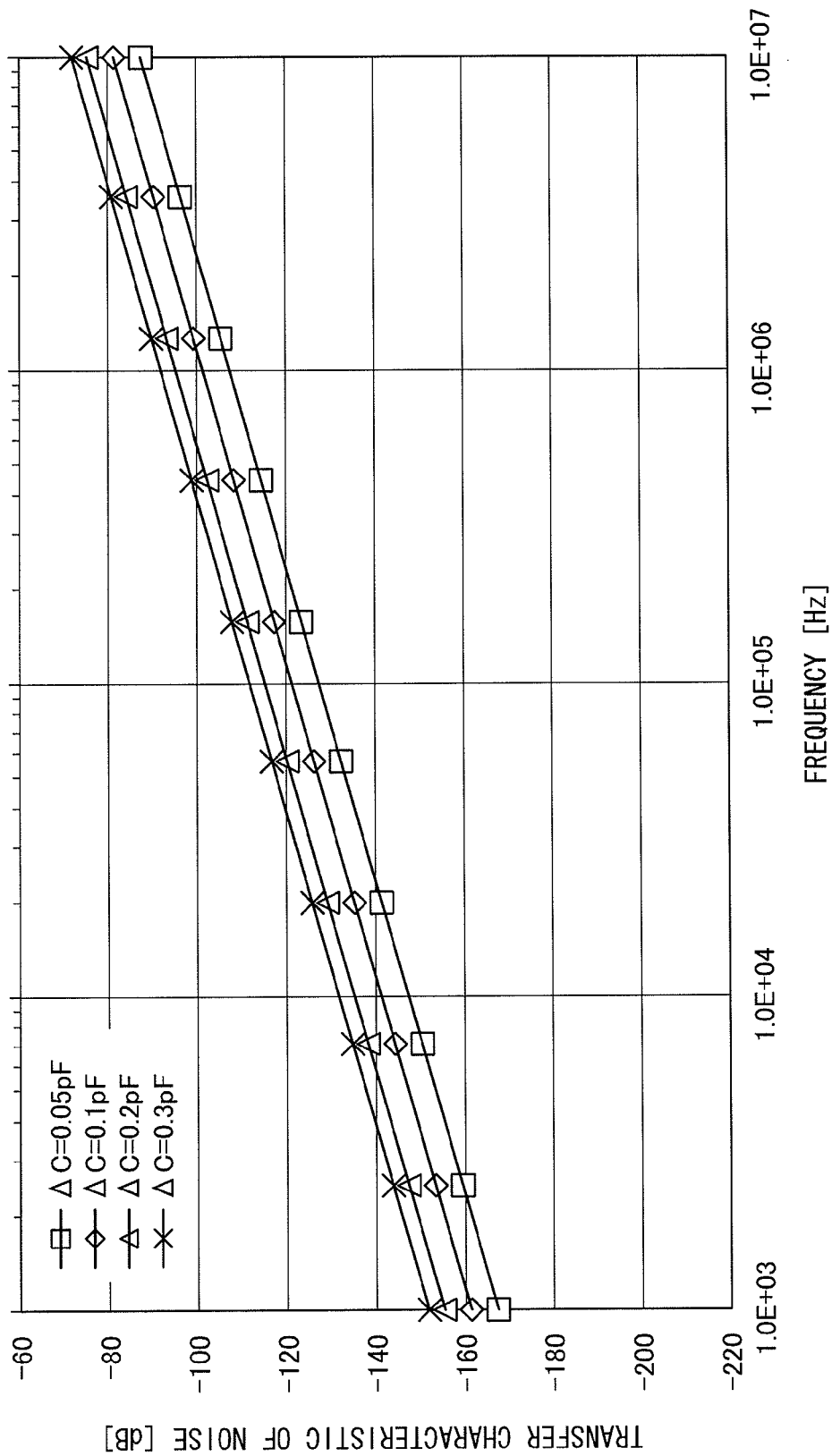
FIG. 14 is a characteristic diagram illustrating results of calculating a frequency characteristic of the transfer characteristic of noise in a configuration example in accordance with the related art.

FIG. 4 is a transfer characteristic diagram of noise that explains the effects of the present invention. In comparison with the transfer characteristic of noise of the conventional configuration shown in FIG. 14, the variability of the parasitic capacitance is reduced by two digits. Thus, it can be seen that the transfer characteristic is attenuated by 40 dB, and the vulnerability to noise is greatly improved.

Figure 5:
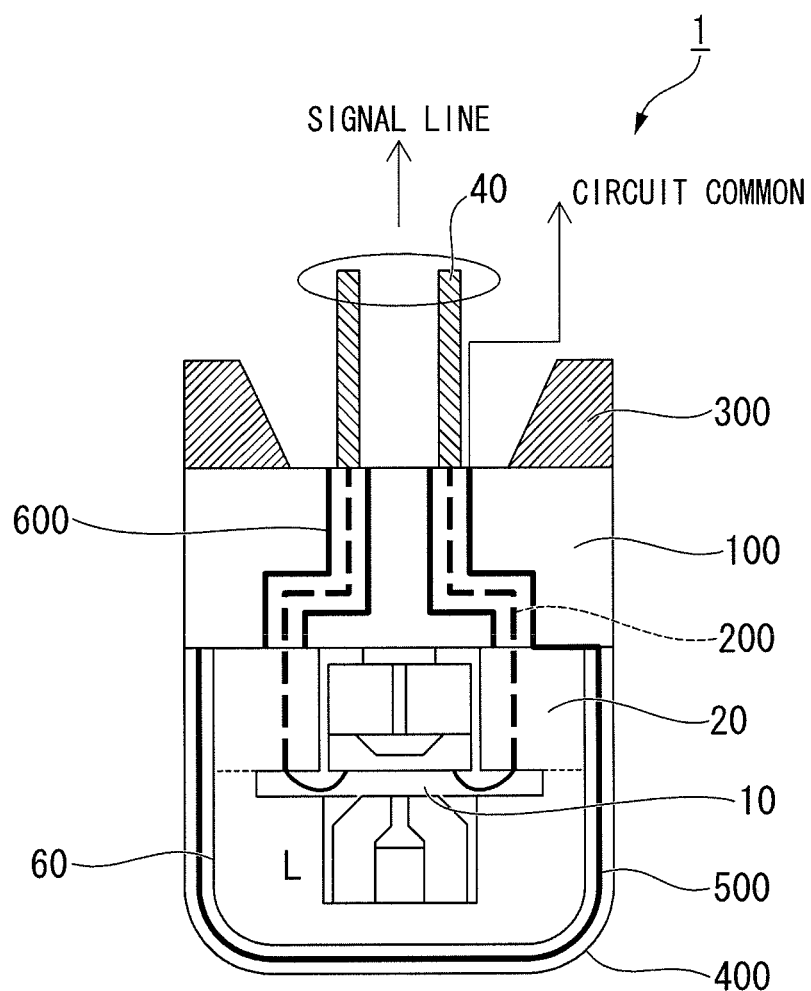
FIG. 5 is a cross-sectional view illustrating a sensor unit in accordance with a third preferred embodiment of the present invention.

FIG. 5 is a cross-sectional view illustrating a sensor unit in accordance with a third preferred embodiment of the present invention. In the third preferred embodiment, shield members 600 are provided to surround respective internal wirings 200 penetrating a ceramic member 100, are electrically connected together with a metal film shield 500 formed on an inner circumferential surface of an insulator cap 400, and are connected to a circuit common. As a result, the sensor unit 1 is floated.

Figure 6:
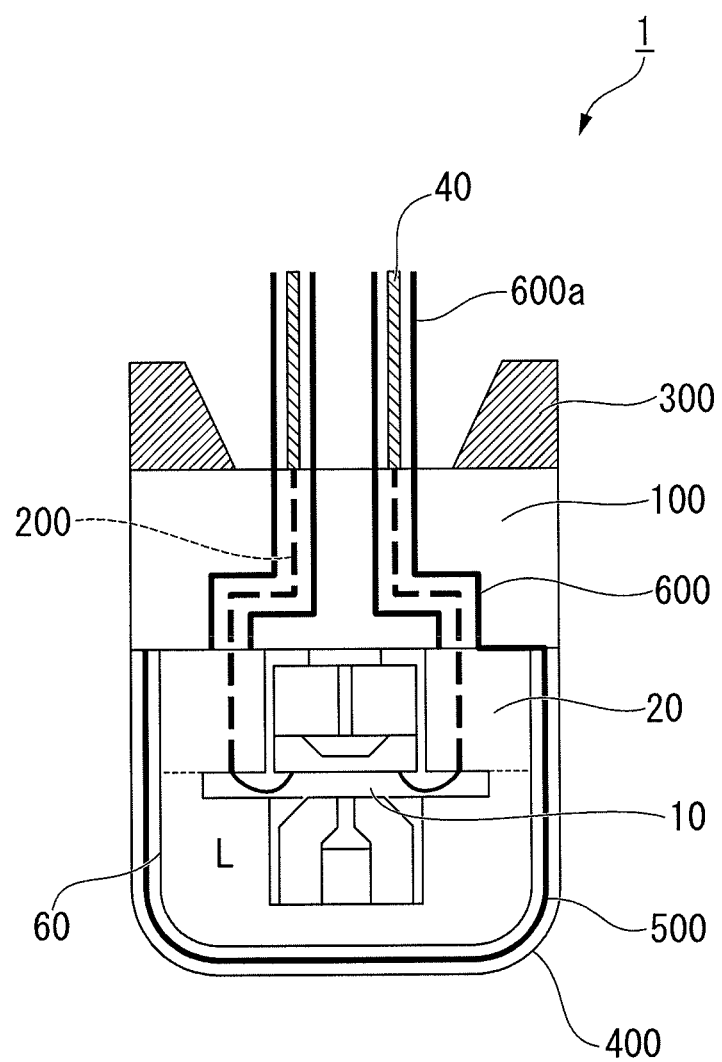
FIG. 6 is a cross-sectional view illustrating a sensor unit in accordance with a fourth preferred embodiment of the present invention.

FIG. 6 is a cross-sectional view illustrating a sensor unit in accordance with a fourth preferred embodiment of the present invention. In the fourth preferred embodiment, in addition to the shield structures 600 of FIG. 5, the sensor unit includes shield structures 600a extending from the shield structures to metal pins 40. Thereby, a floating effect of the sensor unit 1 can be further improved.

FIG. 7A is a cross-sectional view illustrating a sensor unit in accordance with a fifth preferred embodiment of the present invention. In the fifth preferred embodiment, the sensor unit includes a shield member 700 formed by surrounding all of a plurality of internal wirings 200 penetrating a ceramic member 100. In FIG. 7A, an extension insulator 800 exceeding the height of the metal member 300 is connected to a second face 100b of the ceramic member 100, and the internal wirings 200 pass through the extension insulator. The extension insulator 800 extends the shield member 700 to include the internal wirings of the extending portion. Due to this shield structure, a parasitic capacitance between metal pins 40 and the metal member 300 can be reduced.

FIG. 7B is a cross-sectional view illustrating a sensor unit in accordance with a sixth preferred embodiment of the present invention. In FIG. 7B, in place of the extension insulator 800 shown in FIG. 7A, an extension part of a ceramic member 100 is provided, and a shield effect is the same.

Figure 8:
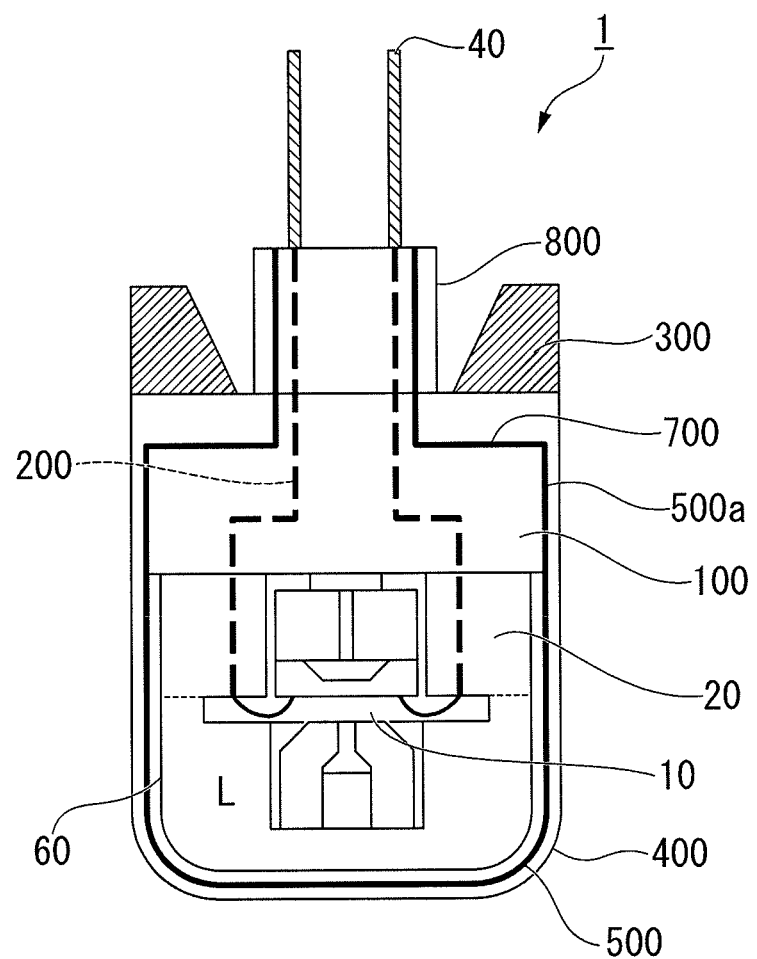
FIG. 8 is a cross-sectional view illustrating a sensor unit in accordance with a seventh preferred embodiment of the present invention.

FIG. 8 is a cross-sectional view illustrating a sensor unit in accordance with a seventh preferred embodiment of the present invention. The seventh preferred embodiment is a modification of FIG. 7A. A metal film shield member 500 extends throughout the side of a ceramic member 100, thereby providing an extension part 500a. The extension part 500a shields internal wirings 200 in the ceramic member 100, and is connected to a shield member 700 at the side of a second face 100b of the ceramic member 100. The shield effect is the same as in FIG. 7A.

The sensor unit 1 of each preferred embodiment described above is illustrative of the vibratory sensor applied to the differential pressure/pressure transmitter as the sensor part 10. However, the sensor unit is not limited to the vibratory sensor, and may be applied to, for instance, a device in which a junction temperature sensor is subject to vacuum sealing.

As the ceramic member 100 of each preferred embodiment described above, the multilayered ceramic members are illustrated. The ceramic member is not limited to the multilayered ceramic members, and may be obtained by sintering powder ceramic. In this case, the shield members 600 and 700 are made up of metal cylindrical members.

As used herein, the following directional terms "forward, rearward, above, downward, vertical, horizontal, below, transverse, row and column" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, unit or part of a device includes hardware and/or software that is constructed and/or programmed to carry out the desired function.

Moreover, terms that are expressed as "means-plus-function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A sensor unit comprising:
a ceramic member including a first face and a second face opposite to each other with a predetermined interval;
a sensor part mounted on the first face;
a plurality of metal pins fixed to the second face;
a plurality of internal wirings passing through the ceramic member, each of the plurality of internal wirings connecting the sensor part with one of the plurality of metal pins; and
a metal member formed on a circumferential end of the second face and joined with a housing by welding.

2. The sensor unit according to claim 1, further comprising:
an insulator cap covering the sensor part at the first face and fixed to a circumferential edge of the ceramic member; and
a metal film shield member formed on an inner wall of the insulator cap.

3. The sensor unit according to claim 1, wherein the metal member includes a tapered cutout part formed on an inner circumferential wall facing the metal pins.

4. The sensor unit according to claim 1, further comprising:
a first shield member that is formed so as to surround each of the internal wirings passing through the ceramic member.

5. The sensor unit according to claim 4, further comprising:
a second shield member that is formed so as to surround each of the metal pins.

6. The sensor unit according to claim 1, further comprising:
a third shield member that is formed so as to surround all the internal wirings passing through the ceramic member.

7. The sensor unit according to claim 4, wherein
the ceramic member is formed as multilayered ceramic members,
the internal wirings are connected together by first through-wirings between the multilayered ceramic members, and
the first shield member is formed by connecting ring-shaped metal prints formed on the multilayered ceramic members using second through-wirings.

8. The sensor unit according to claim 2, wherein the metal film shield member formed on the inner wall of the insulator cap extends up to the second face of a sidewall of the ceramic member.

9. The sensor unit according to claim 1, wherein the sensor part is mounted on the first face via a support.

10. The sensor unit according to claim 1, wherein the metal member is ring-shaped.

11. The sensor unit according to claim 1, wherein the metal member is made of Kovar (an iron-nickel-cobalt alloy).

12. The sensor unit according to claim 2, wherein the metal film shield member is formed on the inner wall of the insulator cap by one of deposition based on electroless deposition and painting.

13. The sensor unit according to claim 1, wherein the ceramic member has an electrode extraction part, a hole radius of the electrode extraction part is 9 mm, a pin interval between the plurality of metal pins is 3 mm, and a relative permittivity of the ceramic member is 9.

14. The sensor unit according to claim 2, wherein the metal member includes a tapered cutout part formed on an inner circumferential wall facing the metal pins.

15. The sensor unit according to claim 2, further comprising:
   a first shield member that is formed so as to surround each of the internal wirings passing through the ceramic member.

16. The sensor unit according to claim 3, further comprising:
   a first shield member that is formed so as to surround each of the internal wirings passing through the ceramic member.

17. The sensor unit according to claim 2, further comprising:
   a third shield member that is formed so as to surround all the internal wirings passing through the ceramic member.

18. The sensor unit according to claim 3, further comprising:
   a third shield member that is formed so as to surround all the internal wirings passing through the ceramic member.

19. The sensor unit according to claim 6, wherein
   the ceramic member is formed as multilayered ceramic members,
   the internal wirings are connected together by first through-wirings between the multilayered ceramic members, and
   the third shield member is formed by connecting ring-shaped metal prints formed on the multilayered ceramic members using second through-wirings.

* * * * *